US009073324B2

(12) United States Patent
Limb

(10) Patent No.: US 9,073,324 B2
(45) Date of Patent: Jul. 7, 2015

(54) SYSTEM FOR FABRICATING AN INKJET PRINTHEAD

(71) Applicant: Palo Alto Research Center Incorporated, Palo Alto, CA (US)

(72) Inventor: Scott J Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 283 days.

(21) Appl. No.: 13/626,832

(22) Filed: Sep. 25, 2012

(65) Prior Publication Data

US 2014/0082941 A1 Mar. 27, 2014

(51) Int. Cl.

| | |
|---|---|
| ***B23P 19/00*** | (2006.01) |
| ***H05K 13/04*** | (2006.01) |
| ***B41J 2/16*** | (2006.01) |
| ***B41J 2/14*** | (2006.01) |

(52) U.S. Cl.

CPC .......... *B41J 2/1606* (2013.01); *Y10T 29/49401* (2015.01); *B41J 2/162* (2013.01); *B41J 2/1433* (2013.01); *B41J 2/164* (2013.01)

(58) Field of Classification Search

USPC ............ 29/25.35, 890.1, 729; 347/40, 44, 65, 347/66, 85, 86; 156/252, 292

See application file for complete search history.

(56) References Cited

U.S. PATENT DOCUMENTS

| | | | | |
|---|---|---|---|---|
| 5,867,189 | A * | 2/1999 | Whitlow et al. | 347/47 |
| 8,226,207 | B2 * | 7/2012 | Kovacs et al. | 347/45 |
| 8,544,987 | B2 * | 10/2013 | Sambhy et al. | 347/45 |
| 8,646,179 | B2 * | 2/2014 | Law et al. | 29/890.1 |
| 8,851,630 | B2 * | 10/2014 | Sambhy et al. | 347/45 |
| 2011/0122195 | A1 * | 5/2011 | Kovacs et al. | 347/45 |
| 2011/0304671 | A1 * | 12/2011 | Law et al. | 347/44 |
| 2012/0162312 | A1 * | 6/2012 | Ahl et al. | 347/33 |
| 2013/0032051 | A1 * | 2/2013 | Casella et al. | 101/395 |
| 2013/0206857 | A1 * | 8/2013 | Ivri, Yehuda | 239/4 |

* cited by examiner

*Primary Examiner* — Paul D Kim

(74) *Attorney, Agent, or Firm* — Ronald E. Prass, Jr.; Prass LLP

(57) ABSTRACT

A system for fabricating an inkjet printhead that includes an apparatus for depositing a protective coating on an aperture plate unit, the aperture plate unit including a plurality of outlet apertures in the aperture plate unit, the apparatus including a protective coating source and a protective coating dispensing device, and a processor that is programmed to control an automated process for coating an inner surface of each of the plurality of outlet apertures with the protective coating. The protective coating dispensing device coats the inner surface of each of the plurality of outlet apertures by dispensing a measured amount of the protective coating to completely clog each of the plurality of outlet apertures by at least one of spraying the aperture plate unit with the protective coating and rolling the protective coating onto the aperture plate unit.

6 Claims, 4 Drawing Sheets

SYSTEM FOR FABRICATING AN INKJET PRINTHEAD

BACKGROUND

1. Field of the Disclosed Embodiments

This disclosure relates to systems and methods for avoiding adhesion of particles to interior surfaces of fine orifices, particularly orifices in a stainless steel aperture or orifice plate for an inkjet printhead "jetstack," during a high temperature adhesive bonding process used to fabricate the jetstack.

2. Related Art

Phase-change inkjet printing processes often employ inks that are presented as solids in the image forming device. Piezoelectric actuated printheads, referred to as "jetstacks" are used to delivery melted phase-change ink to the substrate where the ink cools to form a raised image.

FIG. 1 illustrates a typical configuration of a phase-change inkjet printhead jetstack 100. As shown in FIG. 1, the exemplary jetstack 100 often includes multiple laminated plates, sheets or layers stacked in a superimposed relationship. The multiple laminated plates, sheets or layers may be formed from different materials, which include stainless steel and polyimide, among others.

In the configuration of the exemplary jetstack 100 shown in FIG. 1, the following plates, sheets or layers may be included: a diaphragm plate 110, with multiple transducers 115, which may include one or more piezoelectric transducers on one surface; an ink pressure chamber plate 120; an inlet/outlet plate 130; an adhesive layer 140, an aperture brace plate 150 (also referred to as "support brace"), and an aperture plate 160, which may also be referred to as an orifice plate or jetstack front face plate. The aperture plate 160 will generally be made of stainless steel and be relatively thin. Typically, the aperture plate 160 and the aperture brace plate 150 are brazed together using, for example, a high temperature interface alloying process, to form an aperture plate/brace plate unit 160,150. The aperture plate/brace plate unit 160,150 may then be glued with the rest of the jetstack using the adhesive layer 140.

The exemplary jetstack 100 may include one or more ink pressure chambers 125 coupled to, or in fluid communication with, one or more ink inlets 170, via which ink is introduced into the exemplary jetstack 100 from one or more ink sources (not shown), and one or more ink ejection outlets, for example, apertures, orifices or nozzles ("apertures/orifices") 165, via which ink is ejected as a stream of ink droplets 190. A typical inkjet printer includes a plurality of jetstacks with a plurality of ink pressure chambers 125 with each of the plurality of ink pressure chambers 125 being in fluid communication with one or more of the apertures/orifices 165. For simplicity and ease of understanding of the configuration of the exemplary jetstack 100 shown in FIG. 1, only two exemplary apertures/orifices 165 are depicted. Each aperture/orifice 165 may be in fluid communication with a respective ink pressure chamber 125 by way of the ink passages indicated by arrows 180. Ink can pass through apertures/orifices 165 during ink drop formation Ink drops can travel in a direction along the path of the stream 190 upon exiting the apertures/orifices 165 toward an image receiving medium (not shown) that is spaced from the aperture plate 160 and the apertures/orifices 165 in the aperture plate 160. The apertures/orifices 165 are thus formed in the aperture plate 160 on an outlet side of the exemplary jetstack 100.

In general then, the jetstack 100 comprises a stack of joined plates that have manifolds to route the ink from ink sources to the image receiving medium via an array of individual jets each ending in a respective aperture/orifice 165 from which ink is dispensed. The plates of the jetstack 100 are aligned such that respective holes in each plate form the ink passages indicated by the arrows 180. The respective holes in each of the layers other than the aperture plate layer may be of a same size or of varying sizes. Common to these devices is that the apertures/orifices 165 are of a significantly smaller cross-sectional dimension than the respective holes in each of the layers above the aperture plate 160.

In operation, the transducers 115 receive an activating signal, and upon activation, depress the portion of the diaphragm plate 110 with which they are associated exerting a pressurizing force on individual ones of the ink pressure chambers 125 pushing the ink downward along the vertical portion of the ink flow path 180 and ejecting the ink as droplets from the respective apertures/orifices 165.

SUMMARY OF THE DISCLOSED EMBODIMENTS

As mentioned above, in a manufacturing process for producing jetstacks, such as that shown in exemplary manner in FIG. 1, the aperture plate 160 and the aperture brace plate 150 are generally bonded together as a unit before being joined to the balance of the layers in the jetstack 100 using an adhesive layer 140. The aperture plate/brace plate unit 160,150 may be bonded to the rest of the jetstack 100 using a high temperature adhesive bonding process, particularly at a polyimide interface provided by the adhesive layer 140 between the aperture plate/base plate unit 160,150 and the rest of the layers of the jetstack 100.

The conventional high temperature adhesive bonding process often results in waste or debris particles, particularly from the adhesive (polyimide) layer 140, which may be considered a "dirty" layer, strongly adhering in the narrow apertures/orifices 165 of the "nozzle" region of the jetstack 100. Particles in the apertures/orifices 165 may be "baked on" surfaces, including inner surfaces, of the apertures/orifices 165 during the polyimide high temperature bonding process. Such "baked on" particles may form partial or complete obstructions of the individual apertures/orifices 165 in the aperture plate 160 of the jetstack 100, thereby adversely affecting the ink jetting from the individual aperture/nozzle 165, and resultantly affecting image quality, if not removed.

Conventionally, removal of these "baked on" particles requires post-processing steps which are very labor intensive and time consuming leading to delay and additional expense in the jetstack fabrication process. As the volume of fabricated jetstacks increases, these shortfalls in conventional methods increase tremendously.

In consideration of the above concerns, it would be advantageous to introduce techniques in the jetstack fabrication process that would significantly reduce, and preferably substantially eliminate, occurrences of debris particles from adhering to the walls of an aperture/orifice during the jetstack fabrication process.

Exemplary embodiments of the systems and methods according to this disclosure may provide a mechanism by which to avoid adherence of debris particles in the aperture/orifice or nozzle region of a jetstack when an aperture plate/brace plate unit is bonded to the other layers of an in-process jetstack unit using a high temperature (polyimide) adhesive bonding process.

Exemplary embodiments may employ a protective coating to substantially fill the aperture/orifice during the bonding process to avoid passage of debris particles into the aperture/orifice or nozzle region during the fabrication process.

Exemplary embodiments may dispose protective coatings in the apertures/orifices that may protect against particle passage into the aperture/orifice region, may deter particle adhesion within the aperture/orifice region, or may promote ease of removal of particles from the aperture/orifice region.

Exemplary embodiments may completely fill apertures/orifices with a protective coating that may be a water soluble coating that may obstruct the apertures/orifices preventing particle intrusion into the apertures/orifices during the fabrication process, the coating being easily removable by rinsing with a liquid such as water.

Exemplary embodiments may coat an aperture plate with an anti-wetting coating before bonding. The low surface energy coating may reduce particle adhesion forces during the fabrication process.

Exemplary embodiments may coat an aperture plate/brace plate unit with a water soluble material using a sprayer, roller, or meniscus-forming apparatus. Examples of water soluble materials may include polyvinyl alcohol, lactose or other like high temperature water soluble materials. After completion of the high temperature bonding process, the water soluble materials may be removed using a water bath or spray.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for avoiding adhesion of particles to interior surfaces of fine orifices, particularly orifices in a stainless steel aperture or orifice plate for an inkjet printhead jetstack, during a high temperature adhesive bonding process used to manufacture the jetstack, will be described, in detail, with reference to the following drawings, in which.

DETAILED DESCRIPTION OF THE DISCLOSED EMBODIMENTS

The systems and methods according to this disclosure for avoiding adhesion of particles to interior surfaces of fine orifices, particularly orifices in a stainless steel aperture or orifice plate for an inkjet printhead jetstack, during a high temperature adhesive bonding process used to manufacture the jetstack, will generally refer to this specific utility for those systems and methods. Exemplary embodiments described and depicted in this disclosure should not be interpreted as being specifically limited to any particular configuration of, for example, a protective coating, aperture plate, aperture plate/brace plate unit or jetstack. In fact, any advantageous use of a temporarily added protective coating to block particle adhesion to the surfaces of small orifices in a high temperature layered fabrication process, including removal of the protective coating and any debris in a simple non-abrasive post processing step, that may benefit from the specific techniques described in exemplary manner in this disclosure, is contemplated.

Figure 1:
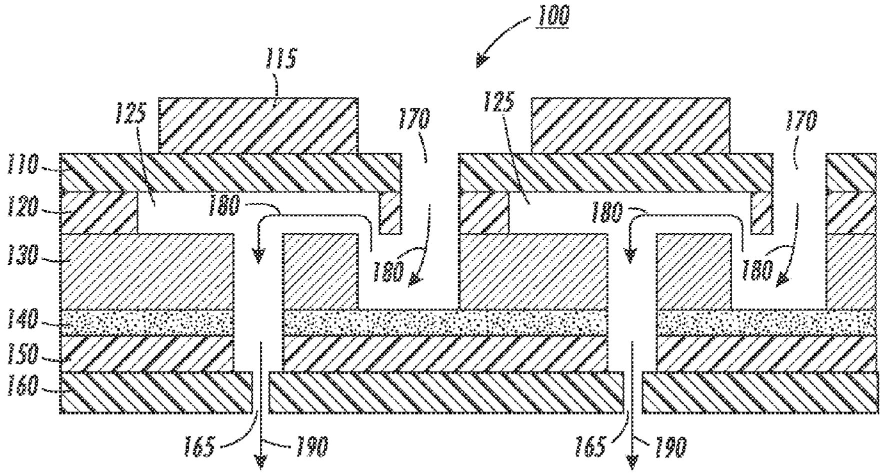
FIG. 1 (Prior Art)
FIG. 1 illustrates a typical configuration of a phase-change inkjet printhead jetstack.

Specific reference to, for example, any particular jetstack configuration should be understood as being exemplary only, and not limited, in any manner, to any particular class of jetstacks of any particular configuration, any particular inkjet printheads or other printheads, or more generally to any particular piezoelectric fluid emission devices. The exemplary order of the layers by which the exemplary jetstack 100 shown in FIG. 1 is formed is also a non-limiting example of an ordering of such layers.

Figure 2:
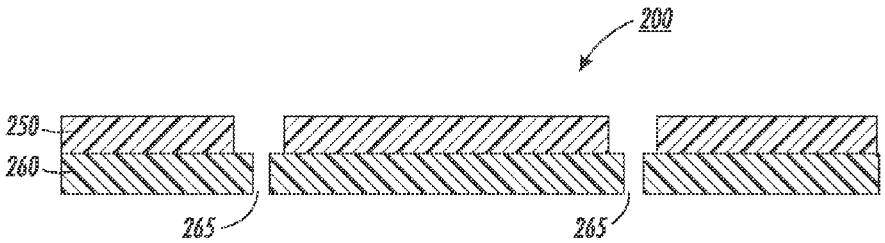
FIG. 2 illustrates a side view of an aperture plate/brace plate unit that may be subjected to a protective coating process according to the methods described in this disclosure.

FIG. 2 illustrates a side view of an aperture plate/brace plate unit 200 that may be subjected to a protective coating process according to the methods described in this disclosure. As shown in FIG. 2, an aperture plate/brace plate unit 200 may be obtained or otherwise prepared in a step of a jetstack fabrication method. The aperture plate/brace plate unit 200 may be prepared by, for example, brazing or otherwise affixing an aperture brace plate layer 250 on a thin, stainless steel aperture plate layer 260, the aperture plate layer 260 including a plurality of outlet apertures/orifices 265. Care will be taken in formation of the aperture plate/base plate unit 200, as will be taken in other processes for forming the jetstack, to ensure that openings in the individual layers are carefully aligned in a manner that will promote smooth flow of the ink in the portion of the ink flow path between an ink pressure chamber (see element 125 in FIG. 1) and an aperture/orifice 265 in the aperture plate layer 260.

Figure 3:
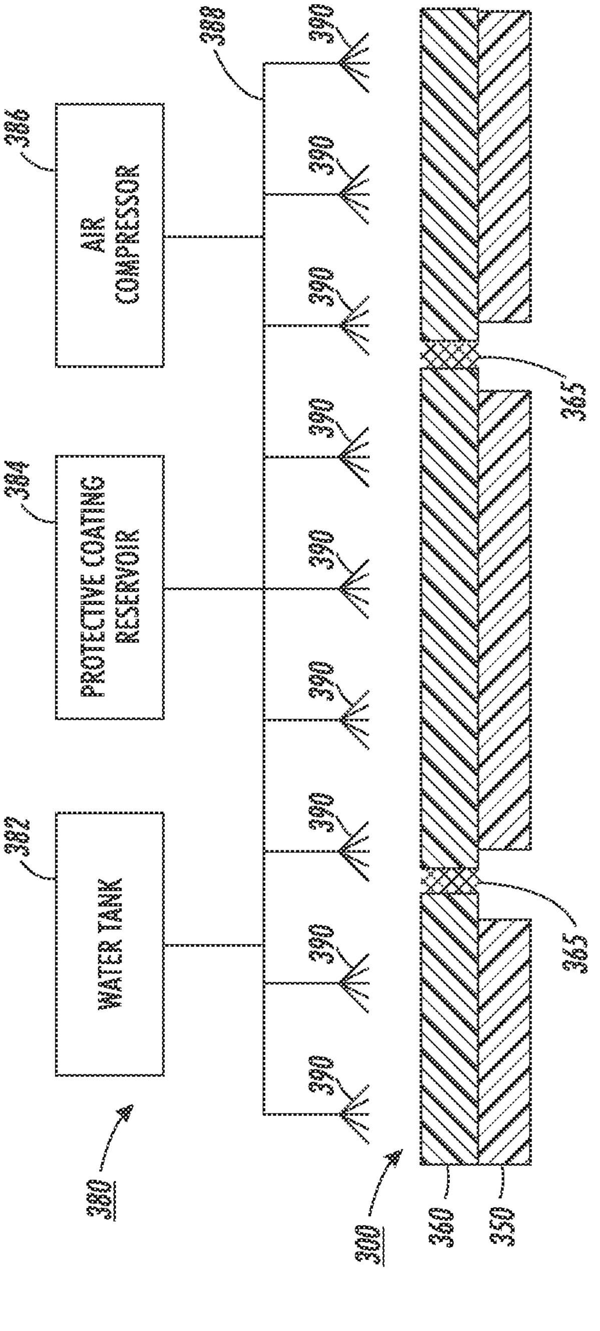
FIG. 3 illustrates a schematic diagram of exemplary apparatus that may be usable as a delivery method for delivering a protective coating to, and/or removing a protective coating from, an aperture plate/brace plate unit according to the methods described in this disclosure.

FIG. 3 illustrates a schematic diagram of exemplary apparatus 380 that may be usable as a delivery method for delivering a protective coating to, and/or removing a protective coating from, an aperture plate/brace plate unit 300 according to the methods described in this disclosure. In this regard, the exemplary apparatus 380 may be used to coat the aperture plate/brace plate unit 300 with a protective coating, particularly in the apertures/orifices 365 of the aperture plate layer 360, after the aperture plate layer 360 is adhered to the brace plate layer 350 and prior to executing a high temperature adhesive bonding process to produce a jetstack according to known methods. The exemplary apparatus 380 may also be usable to remove the protective coating from the aperture plate/brace plate unit 300, and particularly from the apertures/orifices 365 of the aperture plate layer 360, after the executing of the high temperature adhesive bonding process.

As shown in FIG. 3, the exemplary apparatus 380 may include a manifold 388 connecting a plurality of delivery units 390 to one or more air or liquid delivery components, as will be described in greater detail below. The plurality of delivery units 390 may be in a form of spray nozzles. Otherwise, for delivering a protective coating, a roller device or a meniscus forming device may also or alternatively be used.

As shown, the manifold 388 may be connected to piping by which a protective coating may be applied from a protective coating reservoir 384 via the manifold 388 and the plurality of delivery units 390 to a surface of the aperture plate/brace plate unit 300, particularly in such a manner as to substantially fill each of the apertures/orifices 365 in the aperture plate 360 in the manner shown in FIG. 3. The protective coating may include at least one of an anti-wetting coating or other low surface energy coating to deter adherence of waste and debris particles in the coated areas. Alternatively, the protective coating may comprise a water soluble material that may be easily washed away using a water bath or spray after the bonding process.

The manifold 388 may also be connected to at least one of a water tank (or supply) 382 and an air compressor 386 (or other pressurized air source) to facilitate washing or blowing the protective coating off the finished jetstack and out of the apertures/orifices 365 after fabrication of the jetstack with inclusion of the aperture plate/brace plate unit 300.

Figure 4:
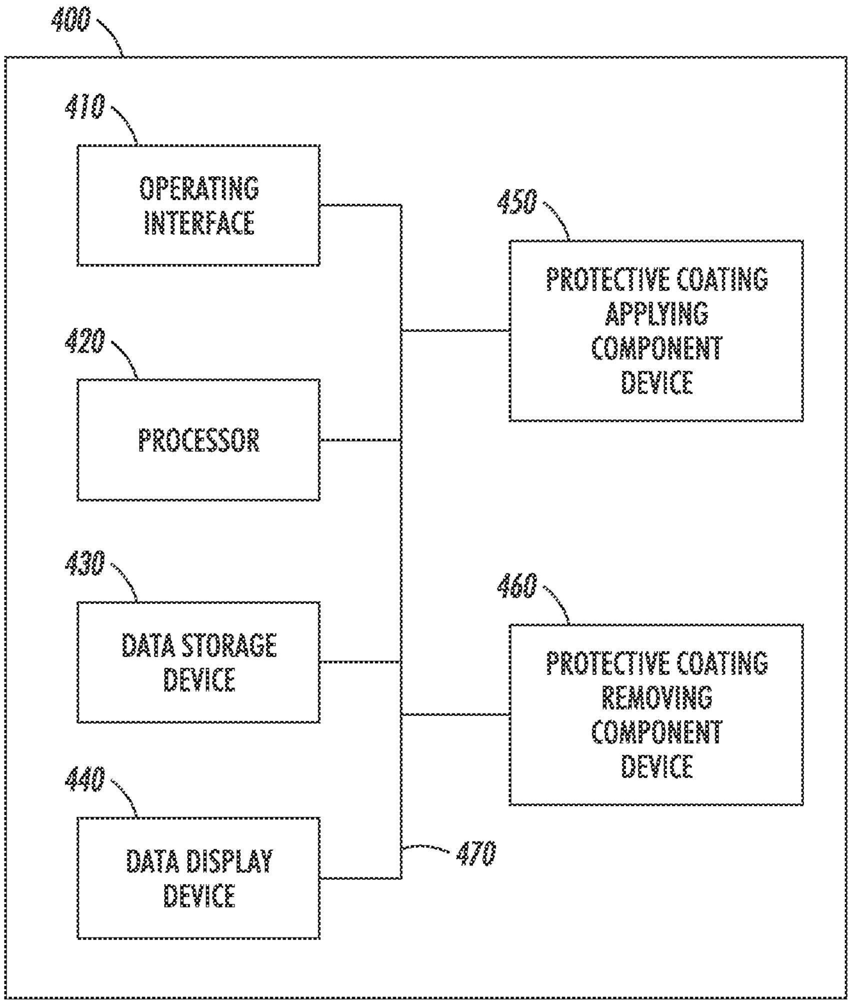
FIG. 4 illustrates a block diagram of an exemplary system for processing an aperture plate/brace plate unit in a jetstack fabrication process according to this disclosure.

FIG. 4 illustrates a block diagram of an exemplary system 400 for processing an aperture plate/brace plate unit in a jetstack fabrication process according to this disclosure.

The exemplary system 400 may include an operating interface 410 by which a user may communicate with the exemplary system 400 for controlling application, and/or removal, of a protective coating to or from an aperture plate/brace plate unit in separate processing steps in a conventional jetstack fabrication process. The operating interface 410 may be configured as one or more conventional mechanisms common to computer or machine control devices that permit a user to input information to the exemplary system 400. The operating interface 410 may include, for example, a conventional keyboard and/or mouse/touchpad pointing system, a touchscreen with "soft" buttons or with various components for use with a compatible stylus, a microphone by which a user may provide oral commands to the exemplary system 400 to be "translated" by a voice recognition program, or other like device by which a user may communicate specific operating instructions to the exemplary system 400. The operating interface 410 may also be in a form of a graphical user interface or GUI associated with a jetstack processing apparatus of which the exemplary system 400 may be a part.

The exemplary system 400 may include one or more local processors 420 for individually operating the exemplary system 400 and for carrying out and controlling operating functions regarding application and removal of protective coatings from aperture plate/brace plate units according to this disclosure. Processor(s) 420 may include at least one conventional processor or microprocessor that interprets and executes instructions to direct specific functioning of the exemplary system 400. Processor(s) 420 may initiate and control functioning of at least one of a protective coating applying component device 450 and a protective coating removing component device 470 that may be in a form of, or in a variation of, the exemplary apparatus 380 shown in FIG. 3.

The exemplary system 400 may include one or more data storage devices 430. Such data storage device(s) 430 may be used to store data or operating programs to be used by the exemplary system 400, and specifically the processor(s) 420 in carrying out their control of the protective coating application and removal processes of the exemplary system 400. Data storage device(s) 430 may be used to store specific operating programs that may be useful in selection of specific application schemes for a protective coating undertaken by a protective coating applying component device 450. The data storage device(s) 430 may include a random access memory (RAM) or another type of dynamic storage device that is capable of storing updateable information, and separately storing instructions for execution of system operations by, for example, processor(s) 420. Data storage device(s) 430 may also include a read-only memory (ROM), which may include a conventional ROM device or another type of static storage device that stores static information and instructions for processor(s) 420. Further, the data storage device(s) 430 may be integral to the exemplary system 400, integral to a jetstack processing apparatus of which the exemplary system 400 is a part, or may be provided external to, and in wired or wireless communication with, the exemplary system 400.

The exemplary system 400 may include at least one data display device 440 which may be configured as one or more conventional mechanisms that output information, for example, on system operations. The at least one data display device 440 may include some form of digital data display screen, or, in combination with the operating interface 410, may represent some manner of GUI as noted above with regard to the operating interface 410. The at least one data display device 440 may be employed, for example, to output data on the conduct of a protective coating applying process carried out by a protective coating applying component device 450, and/or of a protective coating removing process carried out by a protective coating removing component device 460, which may be separate or combined devices.

All of the various components of the exemplary system 400, as depicted in FIG. 4, may be connected by one or more data/control busses 470. These data/control busses 470 may provide wired or wireless communication between the various components of the exemplary system 400, whether all of those components are housed integrally in, or are otherwise external to and in communication with, the exemplary system 400.

It should be appreciated that, although depicted in FIG. 4 as what appears to be a substantially integral unit, the various disclosed elements of the exemplary system 400 may be arranged in any combination of sub-systems as individual components or combinations of components, integral to a single unit, or external to, and in wired or wireless communication with other components or subsystems of the exemplary system 400. In other words, no specific configuration as an integral unit or as a support unit is to be implied by the depiction in FIG. 4. Further, although depicted as individual units for ease of understanding of the details provided in this disclosure regarding the exemplary system 400, it should be understood that the described functions of any of the individually-depicted components may be undertaken, for example, as control inputs from one or more processors 420 controlling the steps of a jetstack fabrication process specifically associated with the use of a protective coating at least on an aperture plate and in output apertures/orifices, as described in detail in this disclosure.

The disclosed embodiments may include a method for processing an aperture plate/brace plate unit in a jetstack fabrication process to add, and subsequently remove, a protective coating in the outlet apertures/orifices of the aperture plate to avoid baking on of waste or debris particle occlusions in the apertures/orifices. According to the disclosed methods, in a jetstack fabrication process, the outlet apertures/orifices may be purposely clogged with a protective coating of known composition. This protective coating may be subsequently relatively easily removed, to avoid an opportunity for particles of organic waste or debris material from migrating into the outlet apertures/orifices in a manner that would allow those particles to potentially become baked on in a polyimide high temperature bonding process. The disclosed method attempts to ensure that the outlet aperture/orifice remains clear of waste or debris particles during the fabrication process by intentionally clogging the outlet aperture/orifice with a substance that can be easily removed subsequent to completion of the fabrication process that may generate the waste or debris particles. In other words, an intentional in-process clogging step is introduced to attempt to ensure that a post process aperture/orifice is substantially free of obstructions, without requiring a rigorous inspection and individual aperture/orifice abrasion process to clear apertures/orifices that became clogged during the fabrication process.

Figure 5:
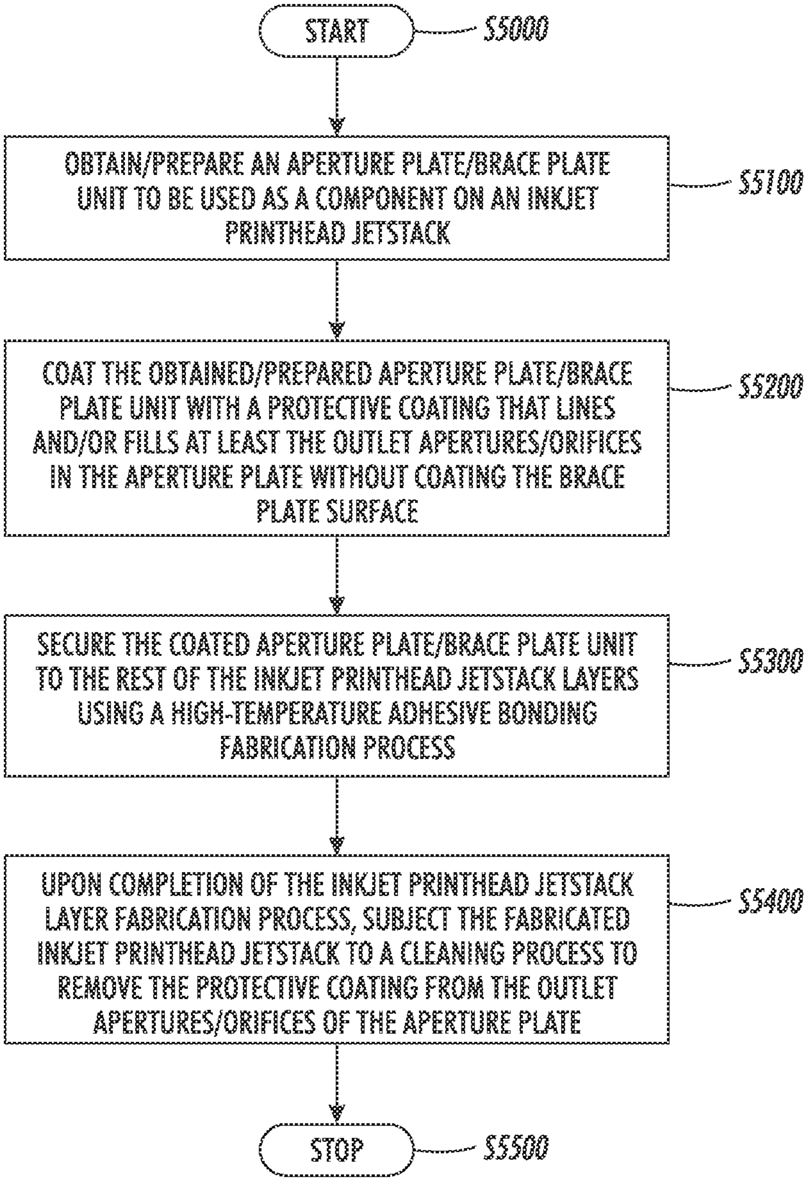
FIG. 5 illustrates a flowchart of an exemplary method for processing an aperture plate/brace plate unit in a jetstack fabrication process according to this disclosure.

FIG. 5 illustrates a flowchart of an exemplary method for processing an aperture plate/brace plate unit in a jetstack fabrication process. As shown in FIG. 5, operation of the method commences at Step S5000 and proceeds to Step S5100.

In Step S5100, an aperture plate/brace plate unit may be obtained, or otherwise prepared in a pre-processing step that may join the aperture plate to the brace plate according to known methods. Operation of the method proceeds to Step S5200.

In Step S5200, the aperture plate/brace plate unit may be subjected to a coating process to coat the aperture plate/brace plate unit in the manner, and according to the compositions, described above. The protective coating is intended to coat the inside surface of each aperture/orifice in the aperture plate portion of the aperture plate/brace plate unit without coating any of the surface that will be eventually adhesively-bonded to another surface. Spraying, rolling, immersing and meniscus forming techniques may be used to dispose the protective coating in the apertures/orifices. In embodiments, based on a cross-sectional area of the apertures/orifices and a viscosity of the protective coating, the apertures/orifices may be practically clogged completely by the protective coating process. Operation of the method proceeds to Step S5300.

In Step S5300, the prepared and coated aperture plate/brace plate may be secured to the rest of an inkjet printhead jetstack of multiple layers via conventional processes, including with a polyimide high-temperature adhesive bonding fabrication process. It is this process that is anticipated to potentially generate debris or waste particles that are now effectively blocked from being able to migrate through, and adhere to the inner walls of, the apertures/orifices now clogged by the protective coating. Operation of the method proceeds to Step S5400.

In Step S5400, upon completion of the inkjet printhead jetstack layer fabrication process, the apertures/orifices may be subjected to a spray, bath or rinse of liquid, including water, by which to effectively wash the protective coating from the aperture plate, and particularly from clogging the apertures/orifices. Alternatively, a compressed gas, such as air, or a combination of a compressed gas and a cooperating liquid may be used to clear the apertures/orifices of the protective coating. Inspection operations may be undertaken in a manual or an automated manner to confirm that the apertures/orifices are clear. Operation of the method proceeds to Step S5500, where operation of the method ceases.

The disclosed embodiments may include a non-transitory computer-readable medium storing instructions which, when executed by a processor, may cause the processor to execute a control scheme to effect all, or at least some, of the steps of the method outlined above.

The above-described exemplary systems and methods reference certain conventional components to provide a brief, general description of suitable operating environments in which the subject matter of this disclosure may be implemented for familiarity and ease of understanding. Although not required, embodiments of this disclosure may include processing components that are provided, at least in part, in a form of hardware circuits, firmware, or software computer-executable instructions to carry out the specific functions described. These may include individual program modules executed by a processor. Generally, program modules include routine programs, objects, components, data structures, and the like that perform particular tasks or implement particular data types in support of the overall objective of the systems and methods according to this disclosure.

Those skilled in the art will appreciate that other embodiments of the disclosed subject matter may be practiced as individual pre-processing steps, in-process steps or post-processing steps supplementing a conventional high temperature adhesive bonding process for fabricating layered inkjet printhead jetstacks that particularly include small cross-section outlet apertures/orifices in a stainless steel aperture plate. Embodiments according to this disclosure may be practiced in differing fabrication devices and methods.

As indicated above, embodiments within the scope of this disclosure may also include computer-readable media having stored computer-executable instructions or data structures that can be accessed, read and executed by one or more processors. Such computer-readable media can be any available media that can be accessed by a processor, general purpose or special purpose computer in implementing the disclosed control functions. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures.

Computer-executable instructions include, for example, non-transitory instructions and data that can be executed and accessed respectively to cause a processor to perform control of certain of the above-specified protective coating and removing functions, individually or in various combinations.

The exemplary depicted sequence of executable instructions or associated data structures represents one example of a corresponding sequence of acts for implementing the functions described in the steps. The exemplary depicted steps may be executed in any reasonable order to effect the objectives of the disclosed embodiments. No particular order to the disclosed steps of the method is necessarily implied by the depiction in FIG. 5, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

I claim:

1. A system for fabricating an inkjet printhead, comprising:

an apparatus for depositing a protective coating on an aperture plate unit, the aperture plate unit including a plurality of outlet apertures in the aperture plate unit, the apparatus including a protective coating source and a protective coating dispensing device; and a processor that is programmed to control an automated process for coating an inner surface of each of the plurality of outlet apertures with the protective coating, wherein the protective coating dispensing device coats the inner surface of each of the plurality of outlet apertures by dispensing a measured amount of the protective coating to completely clog each of the plurality of outlet apertures by at least one of spraying the aperture plate unit with the protective coating and rolling the protective coating onto the aperture plate unit.

2. The system of claim 1, the protective coating comprising at least one of an anti-wetting coating and a water-soluble coating.

3. The system of claim 1, further comprising an apparatus for removing the protective coating from the aperture plate unit, the processor being further programmed to control an automated process for removing the protective coating from the inner surface of each of the plurality of outlet apertures.

4. The system of claim 3, the apparatus for depositing the protective coating on the aperture plate unit and the apparatus for removing the protective coating from the aperture plate unit being a combined apparatus.

5. The system of claim 3, the apparatus for removing the protective coating from the aperture plate unit comprising a removing liquid source and a removing liquid dispensing device.

6. The system of claim 3, the apparatus for removing the protective coating from the aperture plate unit comprising a compressed gas source and a compressed gas dispensing device to blow the protective coating out of each of the outlet apertures with a compressed gas.

* * * * *